United States Patent
Maguire et al.

(10) Patent No.: US 12,193,179 B2
(45) Date of Patent: Jan. 7, 2025

(54) CONTROLLING MULTIPLE STATUS INDICATORS FOR ELECTRONIC EQUIPMENT HOUSED IN AN ELECTRONIC EQUIPMENT CHASSIS

(71) Applicant: Dell Products L.P., Round Rock, TX (US)

(72) Inventors: Amrita Sidhu Maguire, Cedar Park, TX (US); Yuxin Chen, Shanghai (CN); Zhao Chen, Shanghai (CN); Lizzy Yi Sun, Shanghai (CN); Eric Thomas Graham, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 458 days.

(21) Appl. No.: 17/580,821

(22) Filed: Jan. 21, 2022

(65) Prior Publication Data
US 2023/0236633 A1 Jul. 27, 2023

(51) Int. Cl.
*H05K 5/02* (2006.01)
*G05B 23/02* (2006.01)
*G06F 1/16* (2006.01)
*H05K 7/14* (2006.01)
*G06F 1/32* (2019.01)

(52) U.S. Cl.
CPC ....... *H05K 5/0221* (2013.01); *G05B 23/0208* (2013.01); *G06F 1/1683* (2013.01); *H05K 7/1487* (2013.01)

(58) Field of Classification Search
CPC .. H05K 5/0221; H05K 7/1487; H05K 7/1494; G05B 23/0208; G06F 1/1683; G06F 1/182; G06F 1/3215; G06F 1/3287; G06F 3/0482; G06F 1/187

USPC .......................................................... 700/17
See application file for complete search history.

(56) References Cited

U.S. PATENT DOCUMENTS

| | | | |
|---|---|---|---|
| 2019/0148921 A1* | 5/2019 | Bellows | H02B 1/565 361/622 |
| 2020/0101612 A1* | 4/2020 | Peterson | G05B 19/058 |

OTHER PUBLICATIONS

NVM Express, "NVM Express Base Specification, Revision 2.0a," NVM Express, Jul. 23, 2021, 454 pages.
Dell EMC, "Dell EMC SC Series Hybrid Storage Arrays," Specification Sheet, Reference No. SCH040818, 2018, 9 pages.

(Continued)

*Primary Examiner* — Michael J Brown
(74) *Attorney, Agent, or Firm* — Ryan, Mason & Lewis, LLP

(57) ABSTRACT

An apparatus comprises an electronic equipment chassis comprising a housing and at least one lid, the housing comprising a control panel with a first set of one or more status indicators. The apparatus also comprises at least one latch configured for securing the at least one lid to the housing, the at least one latch comprising a second set of one or more status indicators. The apparatus further comprises a processing device configured to determine status information for electronic equipment housed in the electronic equipment chassis, the status information characterizing whether at least one of opening and removing the at least one lid is safe to perform at a given time, and controlling, based at least in part on the determined status information, at least one of the first set of indicators and at least one of the second set of indicators.

20 Claims, 14 Drawing Sheets

(56) References Cited

OTHER PUBLICATIONS

Dell EMC, "Dell EMC PowerVault ME4 Series Storage," Specification Sheet, Reference No. H17384, 2018, 5 pages.
Dell Inc., "Dell PowerVault MD3 Storage Array Series," SS695_PowerVault_MD3_Family_SS_081016, 2016, 2 pages.
International Electrotechnical Commission, International Organization for Standardization, "Graphical Symbols for Use on Equipment," https://www.iso.org/obp/ui/#iso:pub:PUB400008:en, Mar. 2, 2018, 48 pages.
B. Lynn et al., "Introducing the EDSFF E3 Family of Form Factors," KIOXIA America, Inc. White Paper v. 1.3, Sep. 2021, 7 pages.
Dell EMC, "Dell EMC Powervault ME4 Series," Data Sheet, 2018, 2 pages.
Dell EMC, "SC7020 and SC7020F Storage Systems," Owner's Manual, Part No. 680-108-001, Rev. F, Aug. 2021, 21 pages.

* cited by examiner

CONTROLLING MULTIPLE STATUS INDICATORS FOR ELECTRONIC EQUIPMENT HOUSED IN AN ELECTRONIC EQUIPMENT CHASSIS

FIELD

The field relates generally to information processing, and more particularly to managing information processing systems.

BACKGROUND

A given set of electronic equipment configured to provide desired system functionality is often installed in a chassis. Such equipment can include, for example, various arrangements of storage devices, memory modules, processors, circuit boards, interface cards and power supplies used to implement at least a portion of a storage system, a multi-blade server system or other type of information processing system.

The chassis typically complies with established standards of height, width and depth to facilitate mounting of the chassis in an equipment cabinet or other type of equipment rack. For example, standard chassis heights such as 1 U, 2 U, 3 U, 4 U and so on are commonly used, where U denotes a unit height of 1.75 inches (1.75") in accordance with the well-known EIA-310-D industry standard.

SUMMARY

Illustrative embodiments of the present disclosure provide techniques for controlling multiple status indicators for electronic equipment housed in an electronic equipment chassis.

In one embodiment, an apparatus comprises an electronic equipment chassis comprising a housing and at least one lid, the housing comprising a control panel with a first set of one or more status indicators. The apparatus also comprises at least one latch configured for securing the at least one lid to the housing, the at least one latch comprising a second set of one or more status indicators. The apparatus further comprises at least one processing device comprising a processor coupled to a memory, the at least one processing device being configured to perform steps of determining status information for electronic equipment housed in the electronic equipment chassis, the status information characterizing whether at least one of opening and removing the at least one lid is safe to perform at a given time, and controlling, based at least in part on the determined status information, (i) at least one of the first set of one or more status indicators and (ii) at least one of the second set of one or more status indicators.

These and other illustrative embodiments include, without limitation, methods, apparatus, networks, systems and processor-readable storage media.

DETAILED DESCRIPTION

Illustrative embodiments will be described herein with reference to exemplary information processing systems and associated computers, servers, storage devices and other processing devices. It is to be appreciated, however, that embodiments are not restricted to use with the particular illustrative system and device configurations shown. Accordingly, the term "information processing system" as used herein is intended to be broadly construed, so as to encompass, for example, processing systems comprising cloud computing and storage systems, as well as other types of processing systems comprising various combinations of physical and virtual processing resources. An information processing system may therefore comprise, for example, at least one data center or other type of cloud-based system that includes one or more clouds hosting tenants that access cloud resources.

Information technology (IT) assets, also referred to herein as IT equipment, may include various compute, network and storage hardware or other electronic equipment, and are typically installed in an electronic equipment chassis. The electronic equipment chassis may form part of an equipment cabinet (e.g., a computer cabinet) or equipment rack (e.g., a computer or server rack, also referred to herein simply as a "rack") that is installed in a data center, computer room or other facility. Equipment cabinets or racks provide or have physical electronic equipment chassis that can house multiple pieces of equipment, such as multiple computing devices (e.g., the storage arrays 106 or other types of servers, storage systems, network devices, etc.). As noted above, an electronic equipment chassis typically complies with established standards of height, width and depth to facilitate mounting of electronic equipment in an equipment cabinet or other type of equipment rack. For example, standard chassis heights such as 1 U, 2 U, 3 U, 4 U and so on are commonly used, where U denotes a unit height of 1.75 inches (1.75") in accordance with the well-known EIA-310-D industry standard.

Figure 1:
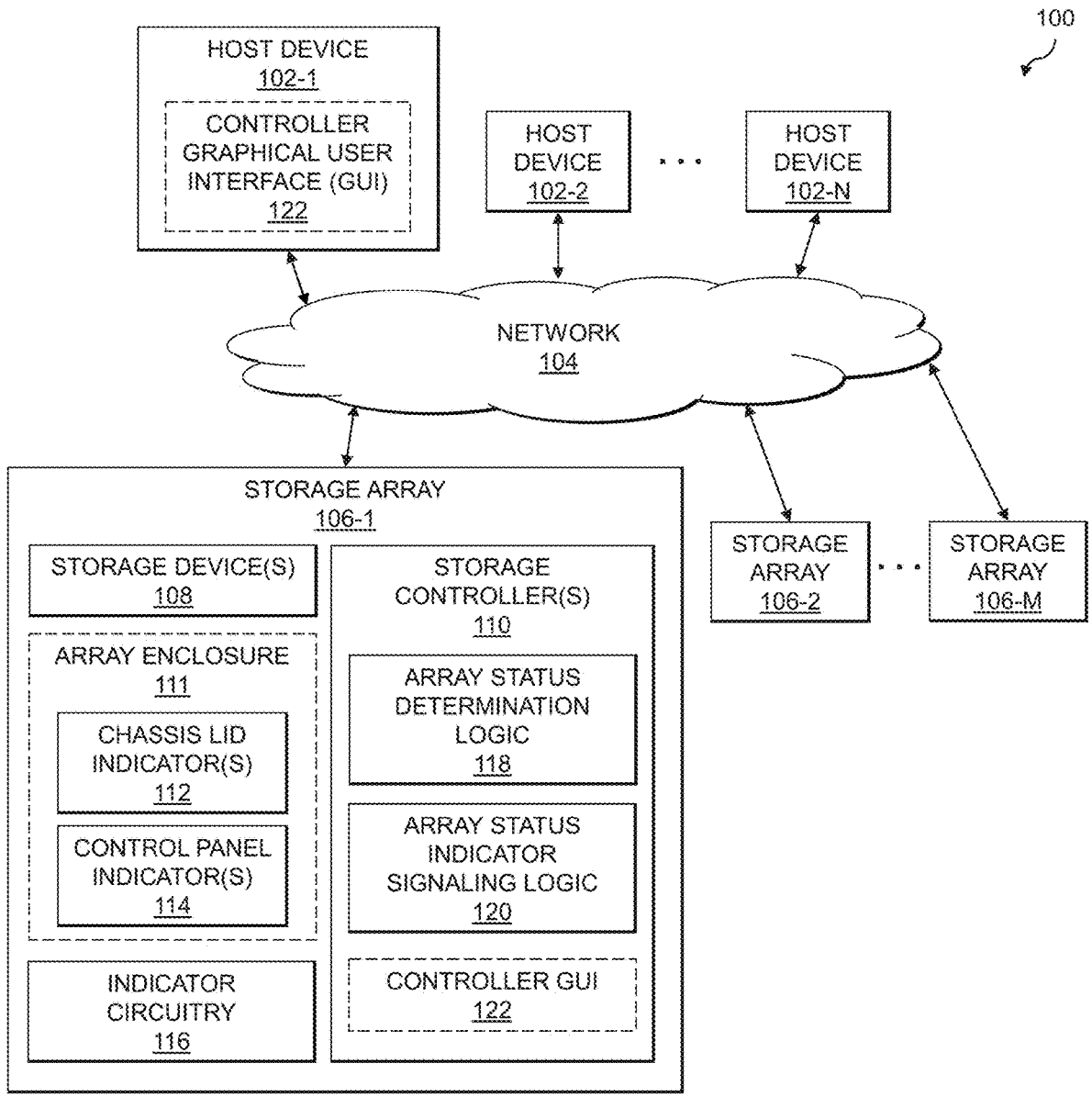
FIG. 1 is a block diagram of an information processing system configured for controlling multiple status indicators for electronic equipment housed in an electronic equipment chassis in an illustrative embodiment.

FIG. 1 shows an information processing system 100 configured in accordance with an illustrative embodiment to provide functionality for controlling multiple status indicators for electronic equipment housed in an electronic equipment chassis. The information processing system 100 comprises one or more host devices 102-1, 102-2, ... 102-N (collectively, host devices 102) that communicate over a network 104 with one or more storage arrays 106-1, 106-2, ... 106-M (collectively, storage arrays 106). The network 104 may comprise a storage area network (SAN). Here, the storage arrays 106 are examples of IT equipment (e.g., hardware IT assets) that may be housed in an electronic equipment chassis.

The storage array 106-1, as shown in FIG. 1, comprises one or more storage devices 108 that may be inserted into a drive bay enclosure comprise hot-swappable drive bays in which the storage devices 108 are mounted or otherwise inserted. The storage devices 108 each store data utilized by one or more applications running on the host devices 102. The storage devices 108 are illustratively arranged in one or more storage pools, such as one or more software-defined storage (SD S) storage pools. The storage array 106-1 also comprises one or more storage controllers 110 that facilitate IO processing for the storage devices 108. The storage array 106-1 and its associated storage devices 108 are an example of what is more generally referred to herein as a "storage system." This storage system in the present embodiment is shared by the host devices 102, and is therefore also referred to herein as a "shared storage system." In embodiments where there is only a single host device 102, the host device 102 may be configured to have exclusive use of the storage system.

The host devices 102 illustratively comprise respective computers, servers or other types of processing devices capable of communicating with the storage arrays 106 via the network 104. For example, at least a subset of the host devices 102 may be implemented as respective virtual machines of a compute services platform or other type of processing platform. The host devices 102 in such an arrangement illustratively provide compute services such as execution of one or more applications on behalf of each of one or more users associated with respective ones of the host devices 102.

The term "user" herein is intended to be broadly construed so as to encompass numerous arrangements of human, hardware, software or firmware entities, as well as combinations of such entities.

Compute and/or storage services may be provided for users under a Platform-as-a-Service (PaaS) model, an Infrastructure-as-a-Service (IaaS) model, a Function-as-a-Service (FaaS) model and/or a Storage-as-a-Service (STaaS) model, although it is to be appreciated that numerous other cloud infrastructure arrangements could be used. Also, illustrative embodiments can be implemented outside of the cloud infrastructure context, as in the case of a stand-alone computing and storage system implemented within a given enterprise.

The storage devices 108 of the storage array 106-1 may implement logical units (LUNs) configured to store objects for users associated with the host devices 102. These objects can comprise files, blocks or other types of objects. The host devices 102 interact with the storage array 106-1 utilizing read and write commands as well as other types of commands that are transmitted over the network 104. Such commands in some embodiments more particularly comprise Small Computer System Interface (SCSI) commands, although other types of commands can be used in other embodiments. A given IO operation as that term is broadly used herein illustratively comprises one or more such commands. References herein to terms such as "input-output" and "IO" should be understood to refer to input and/or output. Thus, an IO operation relates to at least one of input and output.

Also, the term "storage device" as used herein is intended to be broadly construed, so as to encompass, for example, a logical storage device such as a LUN or other logical storage volume. A logical storage device can be defined in the storage array 106-1 to include different portions of one or more physical storage devices. Storage devices 108 may therefore be viewed as comprising respective LUNs or other logical storage volumes.

In the information processing system 100 of FIG. 1, multiple ones of the storage arrays 106 may be part of a storage cluster, and the host devices 102 may submit IO operations to be processed by the storage cluster. The storage cluster may comprise or provide an SDS system with one or more SDS storage pools.

The storage controllers 110 of storage array 106-1 are assumed to implement functionality for indicating the status of one or more designated types of operations running on the storage array 106-1 at various locations, such as chassis lid indicators 112 and control panel indicators 114 of an array enclosure 111 (e.g., an electronic equipment chassis housing at least the storage array 106-1) utilizing indicator circuitry 116. The indicator circuitry 116 may comprise one or more lights (e.g., light-emitting diodes (LEDs)) or other visual indicators of the chassis lid indicators 112 and control panel indicators 114 of the array enclosure 111. The storage controllers 110 of storage array 106-1 may do so utilizing array status determination logic 118 and array status indicator signaling logic 120, and may further communicate the status of the one or more designated types of operations running on the storage array 106-1 via a controller graphical user interface (GUI) 122, which may be presented on one or more of the host devices 102 (e.g., host device 102-1). The array status determination logic 118 is configured to determine whether the one or more designated types of operation are currently running (or are upcoming or scheduled to run within some designated period of time). The array status indicator signaling logic 120 is configured to communicate a status as to whether it is safe to remove a lid or cover of the array enclosure 111. Such status may be a binary status (e.g., it is safe to remove or unsafe to remove), or may comprise more detailed information (e.g., the relative risk of removing the lid or cover of the array enclosure 111 based on the status determined using array status determination logic 118, the particular type of operation or operations that are executing or are scheduled for execution within the designated period of time, etc.). Advantageously, the array status indicator signaling logic 120 can simultaneously communicate the status at multiple locations (e.g., the chassis lid indicators 112, the control panel indicators 114 and the controller GUI 122). It should be noted that "simultaneously" communicating the status to the multiple locations includes communicating the status to each of the multiple locations within some designated threshold time window.

At least portions of the functionality of the array status determination logic 118 and the array status indicator signaling logic 120 may be implemented at least in part in the form of software that is stored in memory and executed by a processor.

Although shown as being implemented internal to the storage controllers 110 of the storage array 106-1, it should be appreciated that the array status determination logic 118 and the array status indicator signaling logic 120 in other embodiments may be implemented at least in part external to the storage controllers 110, including at least partially external to the storage array 106-1 such as within one or more of the host devices 102, one or more other ones of the storage arrays 106-2 through 106-M, one or more external servers, etc.

The host devices 102, storage arrays 106 and storage controllers 110 implementing the array status determination logic 118 and the array status indicator signaling logic 120 in the FIG. 1 embodiment are assumed to be implemented using at least one processing platform, with each processing platform comprising one or more processing devices each having a processor coupled to a memory. Such processing devices can illustratively include particular arrangements of compute, storage and network resources. For example, processing devices in some embodiments are implemented at least in part utilizing virtual resources such as virtual machines (VMs) or Linux containers (LXCs), or combinations of both as in an arrangement in which Docker containers or other types of LXCs are configured to run on VMs.

The host devices 102, the storage arrays 106 and the storage controllers 110 implementing the array status determination logic 118 and the array status indicator signaling logic 120 may be implemented on respective distinct processing platforms, although numerous other arrangements are possible. For example, in some embodiments at least portions of one or more of the host devices 102, the storage arrays 106 and the storage controllers 110 implementing the array status determination logic 118 and the array status indicator signaling logic 120 are implemented on the same processing platform. The storage controllers 110 implementing the array status determination logic 118 and the array status indicator signaling logic 120, one or more of the storage arrays 106, or combinations thereof, can therefore be implemented at least in part within at least one processing platform that implements at least a subset of the host devices 102.

The network 104 may be implemented using multiple networks of different types to interconnect storage system components. For example, the network 104 may comprise a SAN that is a portion of a global computer network such as the Internet, although other types of networks can be part of the SAN, including a wide area network (WAN), a local area network (LAN), a satellite network, a telephone or cable network, a cellular network, a wireless network such as a WiFi or WiMAX network, or various portions or combinations of these and other types of networks. The network 104 in some embodiments therefore comprises combinations of multiple different types of networks each comprising processing devices configured to communicate using Internet Protocol (IP) or other related communication protocols.

As a more particular example, some embodiments may utilize one or more high-speed local networks in which associated processing devices communicate with one another utilizing Peripheral Component Interconnect express (PCIe) cards of those devices, and networking protocols such as InfiniBand, Gigabit Ethernet or Fibre Channel. Numerous alternative networking arrangements are possible in a given embodiment, as will be appreciated by those skilled in the art.

Although in some embodiments certain commands used by the host devices 102 to communicate with the storage arrays 106 illustratively comprise SCSI commands, other types of commands and command formats can be used in other embodiments. For example, some embodiments can implement IO operations utilizing command features and functionality associated with NVM Express (NVMe), as described in the NVMe Specification, Revision 2.0a, July 2021, which is incorporated by reference herein. Other storage protocols of this type that may be utilized in illustrative embodiments disclosed herein include NVMe over Fabric, also referred to as NVMe-oF, and NVMe over Transmission Control Protocol (TCP), also referred to as NVMe/TCP.

The storage array 106-1 in the present embodiment is assumed to comprise a persistent memory that is implemented using a flash memory or other type of non-volatile memory of the storage array 106-1. More particular examples include NAND-based flash memory or other types of non-volatile memory such as resistive RAM, phase change memory, spin torque transfer magneto-resistive RAM (STT-MRAM) and Intel Optane™ devices based on 3D XPoint™ memory. The persistent memory is further assumed to be separate from the storage devices 108 of the storage array 106-1, although in other embodiments the persistent memory may be implemented as a designated portion or portions of one or more of the storage devices 108. For example, in some embodiments the storage devices 108 may comprise flash-based storage devices, as in embodiments involving all-flash storage arrays, or may be implemented in whole or in part using other types of non-volatile memory.

As mentioned above, communications between the host devices 102 and the storage arrays 106 may utilize PCIe connections or other types of connections implemented over one or more networks. For example, illustrative embodiments can use interfaces such as Internet SCSI (iSCSI), Serial Attached SCSI (SAS) and Serial ATA (SATA). Numerous other interfaces and associated communication protocols can be used in other embodiments.

The storage arrays 106 in some embodiments may be implemented as part of a cloud-based system.

The storage devices 108 of the storage array 106-1 can be implemented using solid state drives (SSDs). Such SSDs are implemented using non-volatile memory (NVM) devices such as flash memory. Other types of NVM devices that can be used to implement at least a portion of the storage devices 108 include non-volatile random access memory (NVRAM), phase-change RAM (PC-RAM) and magnetic RAM (MRAM). These and various combinations of multiple different types of NVM devices or other storage devices may also be used. For example, hard disk drives (HDDs) can be used in combination with or in place of SSDs or other types of NVM devices. Accordingly, numerous other types of electronic or magnetic media can be used in implementing at least a subset of the storage devices 108.

The storage arrays 106 may additionally or alternatively be configured to implement multiple distinct storage tiers of a multi-tier storage system. By way of example, a given multi-tier storage system may comprise a fast tier or performance tier implemented using flash storage devices or other types of SSDs, and a capacity tier implemented using HDDs, possibly with one or more such tiers being server based. A wide variety of other types of storage devices and multi-tier storage systems can be used in other embodiments, as will be apparent to those skilled in the art. The particular storage devices used in a given storage tier may be varied depending on the particular needs of a given embodiment, and multiple distinct storage device types may be used within a single storage tier. As indicated previously, the term "storage device" as used herein is intended to be broadly construed, and so may encompass, for example, SSDs, HDDs, flash drives, hybrid drives or other types of storage products and devices, or portions thereof, and illustratively include logical storage devices such as LUNs.

As another example, the storage arrays 106 may be used to implement one or more storage nodes in a cluster storage system comprising a plurality of storage nodes interconnected by one or more networks.

It should therefore be apparent that the term "storage array" as used herein is intended to be broadly construed, and may encompass multiple distinct instances of a commercially-available storage array.

Other types of storage products that can be used in implementing a given storage system in illustrative embodiments include software-defined storage, cloud storage, object-based storage and scale-out storage. Combinations of multiple ones of these and other storage types can also be used in implementing a given storage system in an illustrative embodiment.

In some embodiments, a storage system comprises first and second storage arrays arranged in an active-active configuration. For example, such an arrangement can be used to ensure that data stored in one of the storage arrays is replicated to the other one of the storage arrays utilizing a synchronous replication process. Such data replication across the multiple storage arrays can be used to facilitate failure recovery in the system 100. One of the storage arrays may therefore operate as a production storage array relative to the other storage array which operates as a backup or recovery storage array.

It is to be appreciated, however, that embodiments disclosed herein are not limited to active-active configurations or any other particular storage system arrangements. Accordingly, illustrative embodiments herein can be configured using a wide variety of other arrangements, including, by way of example, active-passive arrangements, active-active Asymmetric Logical Unit Access (ALUA) arrangements, and other types of ALUA arrangements.

These and other storage systems can be part of what is more generally referred to herein as a processing platform comprising one or more processing devices each comprising a processor coupled to a memory. A given such processing device may correspond to one or more virtual machines or other types of virtualization infrastructure such as Docker containers or other types of LXCs. As indicated above, communications between such elements of system 100 may take place over one or more networks.

The term "processing platform" as used herein is intended to be broadly construed so as to encompass, by way of illustration and without limitation, multiple sets of processing devices and one or more associated storage systems that are configured to communicate over one or more networks. For example, distributed implementations of the host devices 102 are possible, in which certain ones of the host devices 102 reside in one data center in a first geographic location while other ones of the host devices 102 reside in one or more other data centers in one or more other geographic locations that are potentially remote from the first geographic location. The storage arrays 106 may be implemented at least in part in the first geographic location, the second geographic location, and one or more other geographic locations. Thus, it is possible in some implementations of the system 100 for different ones of the host devices 102 and the storage arrays 106 to reside in different data centers.

Numerous other distributed implementations of the host devices 102 and the storage arrays 106 are possible. Accordingly, the host devices 102 and the storage arrays 106 can also be implemented in a distributed manner across multiple data centers.

Additional examples of processing platforms utilized to implement portions of the system 100 in illustrative embodiments will be described in more detail below in conjunction with FIGS. 9 and 10.

It is to be understood that the particular set of elements shown in FIG. 1 for controlling status indicators (e.g., chassis lid indicators 112 and control panel indicators 114 on the array enclosure 111, status indicators presented via the controller GUI 122, etc.) is presented by way of illustrative example only, and in other embodiments additional or alternative elements may be used. Thus, another embodiment may include additional or alternative systems, devices and other network entities, as well as different arrangements of modules and other components.

It is to be appreciated that these and other features of illustrative embodiments are presented by way of example only, and should not be construed as limiting in any way.

Figure 2:
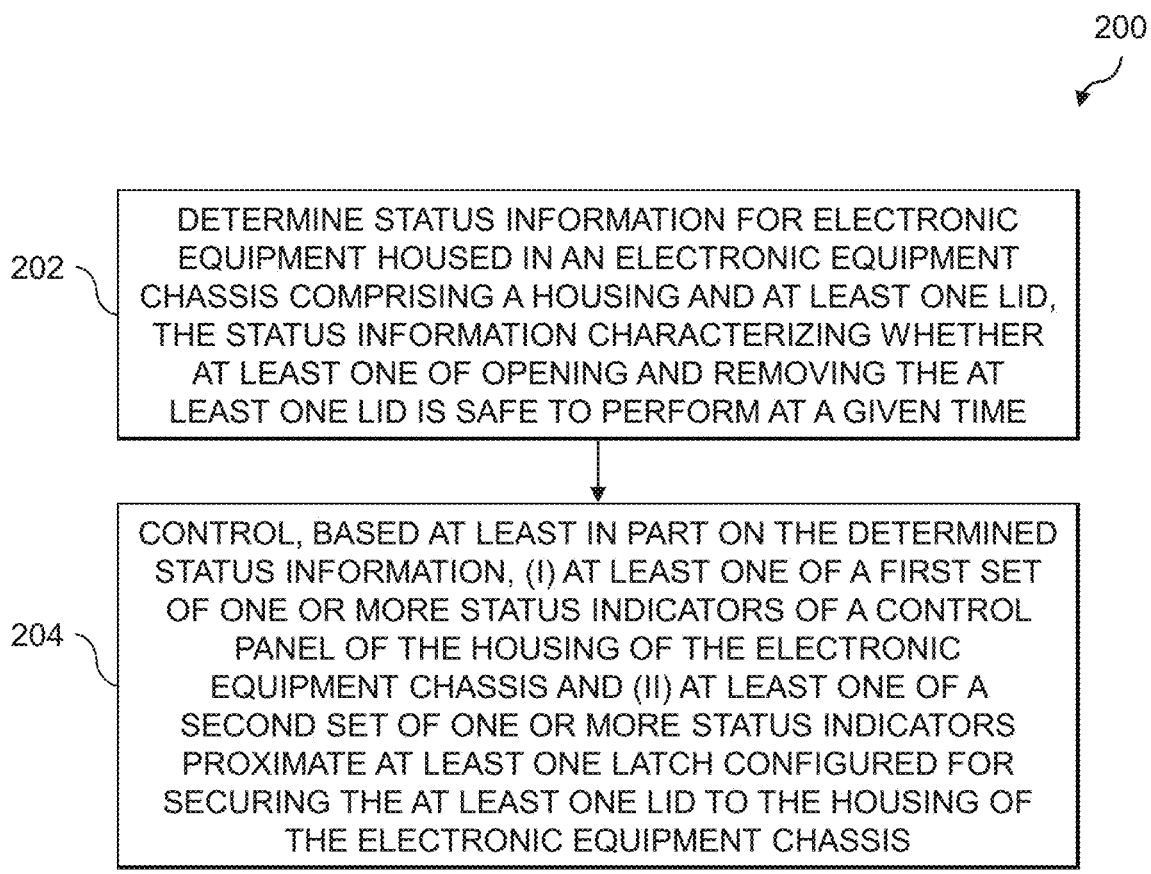
FIG. 2 is a flow diagram of an exemplary process for controlling multiple status indicators for electronic equipment housed in an electronic equipment chassis in an illustrative embodiment.

An exemplary process 200 for controlling multiple status indicators for electronic equipment housed in an electronic equipment chassis will now be described in more detail with reference to the flow diagram of FIG. 2. It is to be understood that this particular process is only an example, and that additional or alternative processes for controlling multiple status indicators for electronic equipment housed in an electronic equipment chassis may be used in other embodiments.

In this embodiment, the process 200 includes steps 202 and 204. These steps are assumed to be performed by the storage controllers 110 utilizing the array status determination logic 118 and the array status indicator signaling logic 120. The process begins with step 202, determining status information for electronic equipment (e.g., storage array 106-1) housed in an electronic equipment chassis (e.g., array enclosure 111) comprising a housing and at least one lid, the status information characterizing whether at least one of opening and removing the at least one lid is safe to perform at a given time. The process continues with step 204, controlling, based at least in part on the determined status information, (i) at least one of a first set of one or more status indicators (e.g., control panel indicators 114) of a control panel of the housing of the electronic equipment chassis and (ii) at least one of a second set of one or more status indicators (e.g., chassis lid indicators 112) proximate at least one latch configured for securing the at least one lid to the housing of the electronic equipment chassis. The control panel may comprise a front of the housing of the electronic equipment chassis that is visible when the electronic equipment chassis in mounted in one or more equipment racks.

Step 202 may include determining whether one or more designated types of operations are at least one of currently being performed and scheduled to be performed within a designated period of time from a current time utilizing the electronic equipment housed in the electronic equipment chassis. In some embodiments, the electronic equipment housed in the electronic equipment chassis comprises at least one computing device, and the one or more designated types of operations comprise one or more shutdown operations performed on the at least one computing device in response to disruption of power supplied to the at least one computing device. The one or more shutdown operations performed on the at least one computing device in response to disruption of power supplied to the at least one computing device may comprise persisting data stored in volatile memory of the at least one computing device to non-volatile memory. In some embodiments, the electronic equipment housed in the electronic equipment chassis comprises a storage system, and the one or more designated types of operations comprise one or more data caching operations. At least one of opening and removing the at least one lid while the one or more data caching operations are being performed results in potential data loss in the storage system.

The at least one of the first set of one or more status indicators and the at least one of the second set of one or more status indicators may each comprise one or more indicator lights, and step 204 may comprise activating a first designated light pattern utilizing the one or more indicator lights responsive to the determined status information characterizing that at least one of opening and removing the at least one lid is safe to perform at the given time, and activating a second designated light pattern utilizing the one or more indicator lights responsive to the determined status information characterizing that at least one of opening and removing the at least one lid is not safe to perform at the given time. The second designated light pattern may be selected from among a set of possible light patterns based at least in part on a relative risk associated with at least one of opening and removing the at least one lid at the given time, the relative risk being based at least in part on one or more designated types of operations that are at least one of currently being performed and are scheduled to be performed within a designated period of time from a current time utilizing the electronic equipment housed in the electronic equipment chassis.

In some embodiments, the at least one latch securing the at least one lid to the housing of the electronic equipment chassis is located over at least a portion of a battery backup unit circuit board of the electronic equipment housed in the electronic equipment chassis. The at least one latch may comprise one or more luminous holes aligned with one or more LEDs of the battery backup unit circuit board, the one or more LEDs providing the second set of one or more status indicators. One or more light pipes and associated light pipe holders may align the one or more luminous holes of the at least one latch with the one or more LEDs of the battery backup unit circuit board.

In some embodiments step 204 further includes controlling at least one of a third set of one or more status indicators presented via a GUI of a controller that monitors the electronic equipment housed in the electronic equipment chassis. Step 204 may include simultaneously controlling the at least one of the first set of one or more status indicators, the at least one of the second set of one or more status indicators, and the at least one of the third set of one or more status indicators. For example, the first, second and third sets of status indicators may be synchronized with one another or otherwise be used to communicate either a "safe to remove" or "unsafe to remove" status to an operator, customer or other end-user (e.g., such as IT support staff performing servicing of the electronic equipment housed in the electronic equipment chassis).

Various types of hardware information technology (IT) assets may be placed within a housing or equipment chassis. Such hardware IT assets may include, but are not limited to, computing systems, storage systems, network systems, etc. The housing or equipment chassis may comprise, for example, a rackmount server. Rackmount servers may be used for various types of hardware IT assets. In various embodiments described below, it is assumed that the hardware IT assets housed in the equipment chassis comprise devices or components of a storage system (e.g., for a storage server or storage array, a disk array enclosure (DAE), a disk processor enclosure (DPE), etc.). It should be appreciated, however, that embodiments are not limited solely to use with storage systems in an equipment chassis. Equipment chassis described herein which are configured with functionality for controlling multiple status indicators for electronic equipment housed in an electronic equipment chassis may include various other types of systems, including systems with various combinations of different types of hardware IT assets (e.g., compute devices, storage devices, network devices, memory, etc.)

Rackmount servers and other types of equipment chassis may be configured to support multiple hardware IT assets, such as multiple storage rives. As an example, an equipment chassis in a 2 U configuration, where "U" denotes a unit height of 1.75 inches (1.75") in accordance with the well-known EIA-310-D industry standard, may house 40 to 44 Enterprise and Data Center Standard Form Factor (EDSSF) E3 devices. The E3 form factor may be used for various types of devices, including but not limited to SSD, NVMe, storage-class memory (SCM), Compute Express Link (CXL), dynamic random-access memory (DRAM), Accelerator technologies, etc.

A storage system in a 2 U equipment chassis will have significantly higher storage capacity utilizing E3 format storage devices such as E3 SSDs (e.g., as measured in terabytes per cubic millimeter, $TB/mm^3$). In such a storage system, caching data loss (DL) on even a very small time scale (e.g., on the order of a tenth of a millisecond (ms) or less) can have a potentially catastrophic impact for the operators, customers or other end-user) that store data on the storage system. Further, even prematurely opening a storage system with high-density E3 form factor storage devices (e.g., an E3 storage appliance) before caching is completed may result in DL.

For various storage systems, operators, customers or other end-users are generally not aware if data caching or power vaulting operations are complete. For example, conventional storage systems lack any warning on a server latch indicating whether data caching or power vaulting operations are completed. The server latch is a latch on a lid of a housing or equipment chassis which, when opened or removed, enables access to internal hardware components of the storage system. If such a lid is opened or removed prior to the data caching or power vaulting operations being completed, then DL may occur. As another example, conventional storage systems do not provide functionality for messaging (e.g., to a GUI or other interface provided by a controller of a storage system, such as an Integrated Dell Remote Access Controller (iDRAC)) as to whether data caching or power vaulting operations have been safely completed. Such a lack of communication or alerting as to when data caching or power vaulting is occurring at the hardware level can lead to DL, as the operators, customers or other end-users are not made aware of the potential for DL if a lid of the housing or equipment chassis is opened or removed prior to the data caching or power vaulting operations being completed.

In some embodiments, an equipment chassis may be configured with an intrusion switch that detects when a lid or cover of the equipment chassis is opened. The intrusion switch, however, does not handshake to a GUI (e.g., via iDRAC or another controller of the system housed in the equipment chassis) and thus cannot communicate a status of one or more designated types of operations of the system housed in the equipment chassis. There is thus a need for techniques which enable communication of the status of the one or more designated types of operations (e.g., operations which, while ongoing, would result in negative impact to the system housed in the equipment chassis if a lid or cover of the equipment chassis is opened). Such designated types of operations may include data caching or power vaulting operations, where if the lid or cover of an equipment chassis is opened while a system housed therein is performing such operations then DL may occur.

Illustrative embodiments provide solutions which address such lack of communication of the status of one or more designated types of operations being performed on a system (e.g., a storage system) that is housed within an equipment chassis. To do so, some embodiments advantageously synchronize status indicators at multiple locations, including one or more status indicators proximate a latch touch point (e.g., of a lid or cover of the equipment chassis), at a control panel of the equipment chassis (e.g., at a front of the housing of the equipment chassis), and at a software console (e.g., providing an interface for management of the system housed within the equipment chassis). Advantageously, through communicating the status of the one or more designated types of operations at such multiple locations (e.g., with visual indicators of the status of such operations, using indicator lights, display icons, etc.), operators, customers or other end-users are made aware of the potential for negative impacts to the system housed within the equipment chassis if a lid or cover of the equipment chassis is opened or removed while such operations are ongoing. In other words, the techniques described herein increase the chances of a successful communication of an "unsafe to remove" status which would prevent or mitigate the risk of an operator, customer or other end-user opening the lid or cover of the equipment chassis (e.g., which may lead to DL or other potentially negative impacts).

In some embodiments, an equipment chassis (e.g., housing a storage system) may provide functionality for mitigating data loss during cache to flash (C2F) operations through a passive status communication not to remove a battery backup unit (BBU), such as a warning "do not remove cover while flashing" via a label that is on the housing (e.g., printed thereon, via a sticker affixed thereto, etc.). Such passive communication of the BBU status, however, does not integrate a status indicator (e.g., one or more light-emitting diodes (LEDs)) into a latch of the lid or cover of the equipment chassis. Further, such passive communication does not enable providing caching status messages (e.g., or other messages as to the status of one or more designated types of operations) to a control panel of the equipment chassis (e.g., on a front end of the housing) or in a user interface (e.g., a GUI) provided by a software controller associated with the system (e.g., a storage system) housed therein.

Figure 3A:
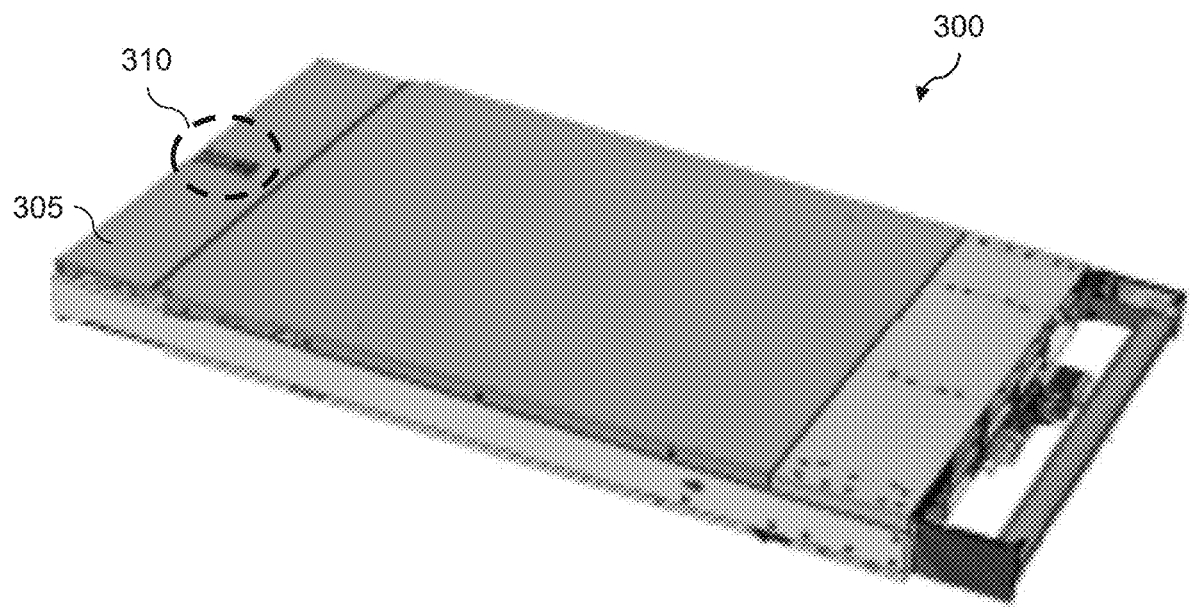
FIGS. 3A and 3B show views of an equipment chassis with a latch comprising a status indicator in an illustrative embodiment.
Figure 3B:
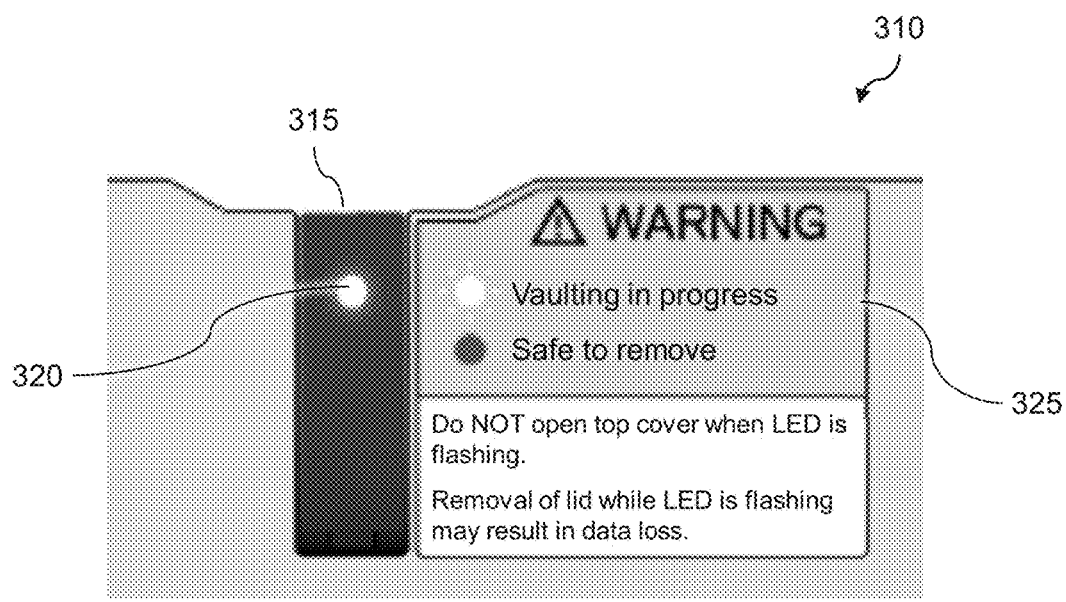

As noted above, in illustrative embodiments the status of one or more designated types of operations that are executing on hardware IT assets housed within an equipment chassis are communicated via multiple status indicators to provide "error-proof" messaging that a lid or cover of the equipment chassis should not be opened (e.g., while the one or more designated types of operations are executing). FIG. 3A shows an example of an electronic equipment chassis 300 in the form of a rackmount storage server having a lid or cover 305. FIG. 3B shows a close-up view of a portion 310 of the lid 305, including a latch 315 with an integrated status indicator 320 that is illustratively in the form of a LED. The latch 315 provides an ergonomic lift point for the lid 305, as well as improving the user experience (UX) through maintaining data integrity (e.g., or other operations being performed on the hardware IT assets housed within the electronic equipment chassis 300) via the status indicator 320. The portion 310 of the lid 305 also includes an optional label 325, which communicates to an operator, customer or end-user (e.g., IT support staff which may provide servicing of the system housed in the electronic equipment chassis 300) what the integrated status indicator 320 is communicating (e.g., an "unsafe to remove" status). The label 325 may further indicate the consequences of opening or removing the lid 305 while the one or more designated types of operations are executing (e.g., that DL may occur if the lid 305 is removed while a storage system housed in the electronic equipment chassis 300 is performing data caching or power vaulting operations).

In the FIG. 3B example, the integrated status indicator 320 blinks or flashes when one or more designated types of operations (e.g., a data caching or power vaulting operation) are being executed on the system (e.g., a storage system) housed in the electronic equipment chassis 300, and is off when the lid 305 is safe to open or remove. It should be appreciated, however, that this particular control of the status indicator 320 is not a requirement. For example, in other embodiments the status indicator 320 may be either solid on (e.g., when the lid 305 is not safe to remove) or solid off (e.g., when the lid 305 is safe to remove), the status indicator 320 may change color (e.g., from a first color such as amber when the lid 305 is not safe to remove to a second color such as green when the lid 305 is safe to remove), the status indicator 320 may change its frequency or pattern of blinking or flashing (e.g., a first blinking or flashing frequency or pattern indicating that that lid 305 is not safe to remove and a second blinking or flashing frequency or pattern indicating that the lid 305 is safe to remove), combinations thereof, etc.

Further, in some embodiments the status indicator 320 has more than two different options for communicating a status of one or more designated types of operations executing on the system housed in the electronic equipment chassis 300 and whether the lid 305 is safe to remove or not. As an example, the status indicator 320 may be off when the lid 305 is safe to remove, is solid on when the lid 305 is not safe to remove because a first designated type of operation is executing on the system housed in the electronic equipment chassis 300, and blinks when the lid 305 is not safe to remove because a second designated type of operation is executing on the system housed in the electronic equipment chassis 300. The choice of whether the status indicator 320 is solid on or blinking may alternatively be used to communicate the riskiness of opening or removing the lid 305 at a given time (e.g., where solid on indicates a first relatively low risk level and where blinking or flashing indicates a second relatively higher risk level). Various combinations of the above are also possible, such as where the color and frequency of blinking and flashing of the status indicator 320 are used to communicate that a given designated type of operation is executing on the system housed in the electronic equipment chassis 300 and/or a risk of opening the lid 305 while the given designated type of operation is executing on the system housed in the electronic equipment chassis 300.

It should also be noted that while FIGS. 3A and 3B show an example where the latch 315 includes only a single status indicator 320, this is not a requirement. In other embodiments, the latch 315 may include multiple status indicators (e.g., multiple LEDs), where the such multiple status indicators may be used to communicate whether it is safe to open the lid 305 or not, the relative risk of opening the lid 305 at a particular time, the particular type(s) of operations executing on the system housed in the electronic equipment chassis 300 (e.g., such as those operations which may be affected by opening of the lid 305), combinations thereof, etc.

Advantageously, control of the status indicator 320 on the latch 315 may be synchronized or tied to one or more other status indicators, such as additional status indicators (e.g., LEDs) that are on a control panel of the electronic equipment chassis (e.g., on a "front" of the housing that is visible while the electronic equipment chassis is installed in a data center or other physical location), as well as a GUI of a controller (e.g., iDRAC) of the system that is housed in the electronic equipment chassis 300. By tying the status indicator 320 to the controller GUI, this enables operators, customers or other end-users of the system housed in the electronic equipment chassis 300 to see the status of one or more designated types of operations (e.g., on a UI masthead). This can allow the operators, customers or other end-users of the system housed in the electronic equipment chassis 300 to see and confirm whether the designated types of operations are currently executing before initiating any action (e.g., which would cause or result in the lid 305 being opened or removed). This can advantageously prevent new users that are unfamiliar with the status indicator 320 on the latch 315 from inadvertently causing potential DL or other negative impact to the system housed within the electronic equipment chassis 300. An intrusion switch, if present, can also be linked with the status indicator 320 on the latch 315 (as well as status indicators on a control panel of the housing of the electronic equipment chassis 300 and the GUI) to communicate the status of the one or more designated types of operations.

The enclosure latch 315 with the integrated visual status indicator 320 provides various advantages in warning operators, customers or other end-users to not prematurely open the lid 305 of the electronic equipment chassis 300 while one or more designated types of operations are executing on a system housed in the electronic equipment chassis 300. This can mitigate potential DL or other negative impacts, through communication via the status indicator 320 on the latch 315. Further, as discussed above and elsewhere herein, the control of the status indicator 320 may be synchronized or otherwise linked with additional status indicators (e.g., intrusion switches, a control panel of the housing of the electronic equipment chassis 300, a GUI of a controller of the electronic equipment chassis 300 or a system housed therein, etc.). The status indicator 320 (as well as the additional status indicators), may in some embodiments be controlled using an integrated controller (e.g., iDRAC), such as through firmware (FW) or software (SW) thereof, including the use of interrupt requests (IRQs) communicated based on the status of the lid 305 (e.g., whether the lid is opened/removed or not).

Figure 4A:
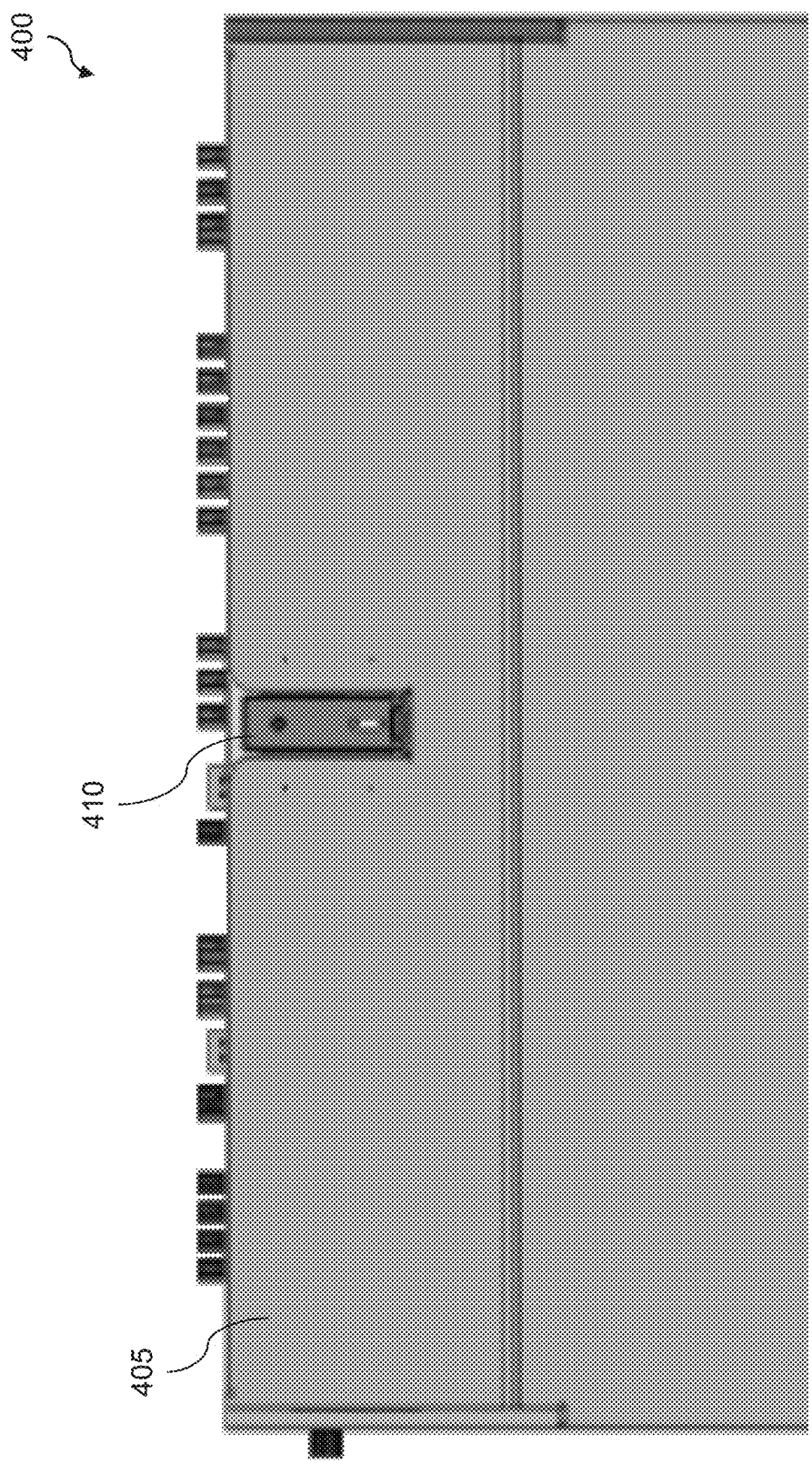
FIGS. 4A-4D show views of an equipment chassis with a latch comprising a status indicator in an illustrative embodiment.
Figure 4B:
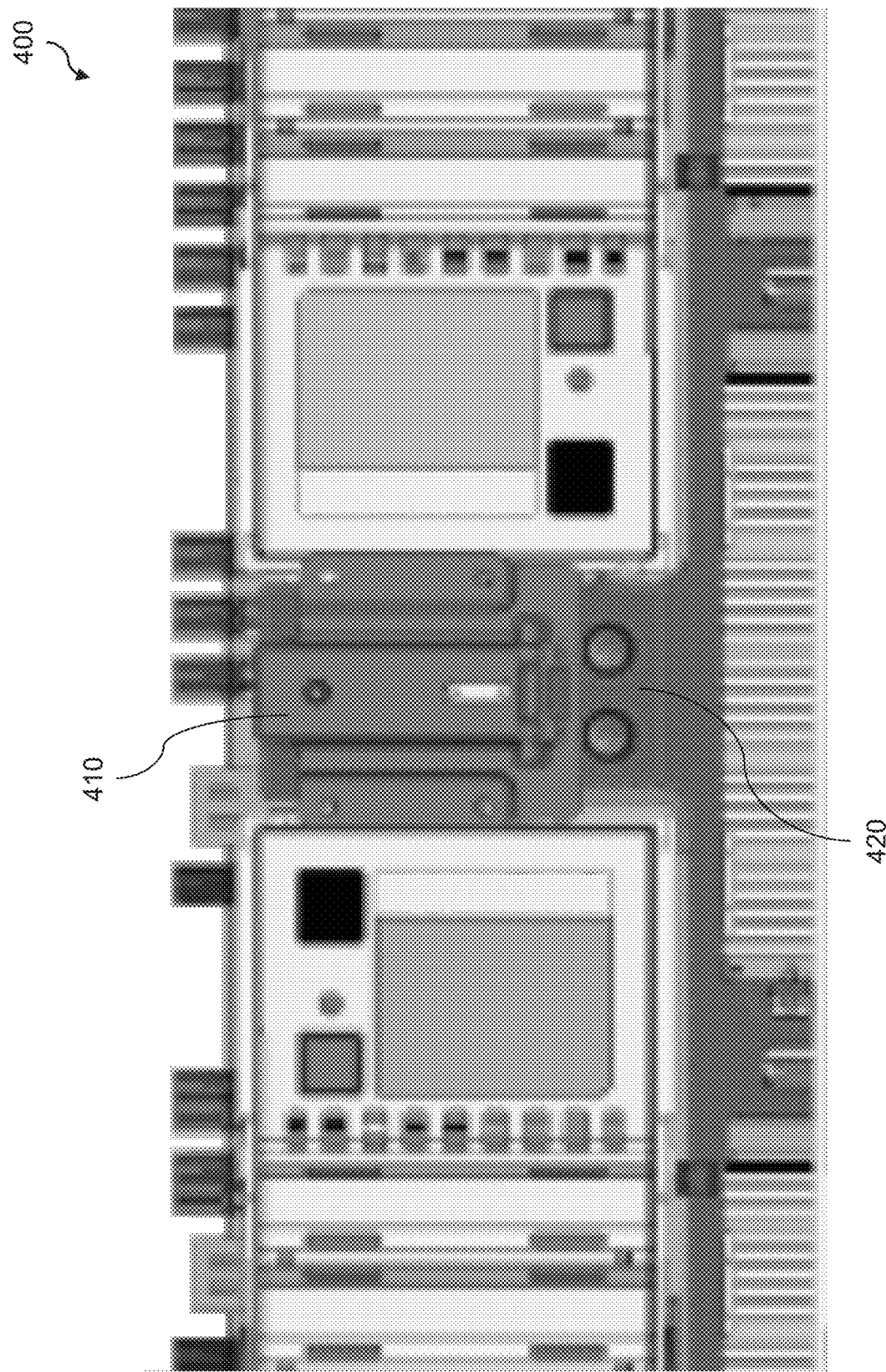
Figure 4C:
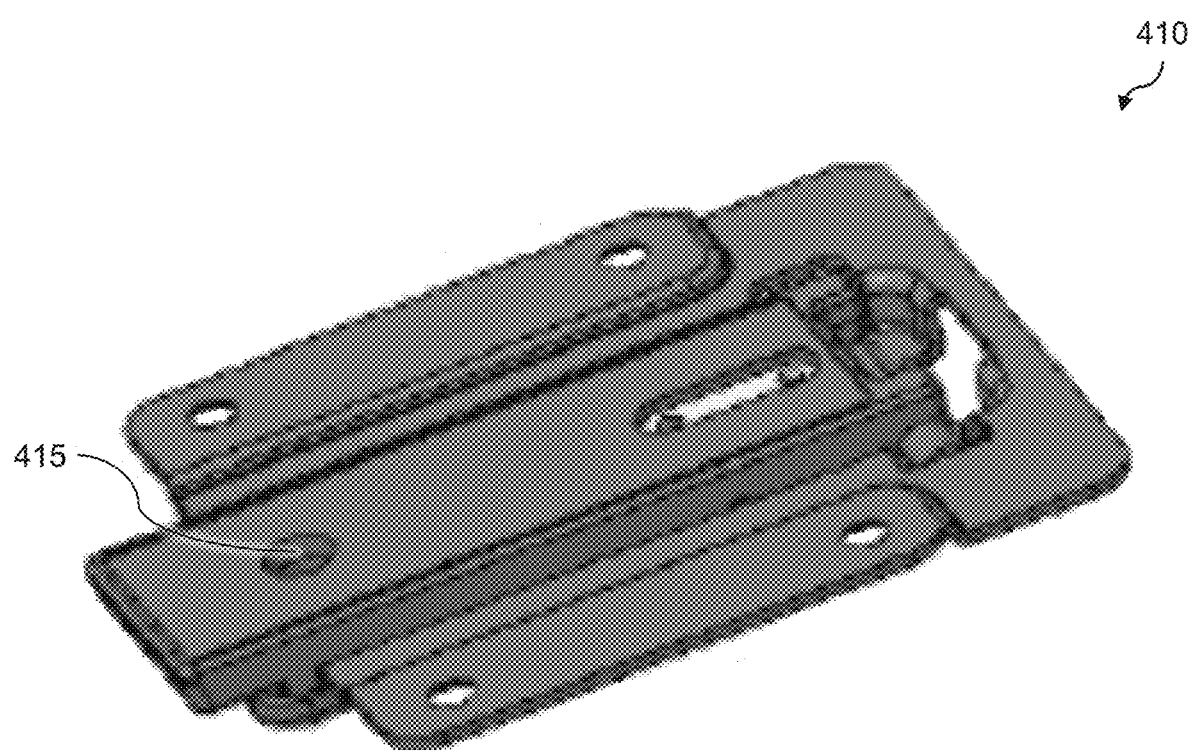
Figure 4D:
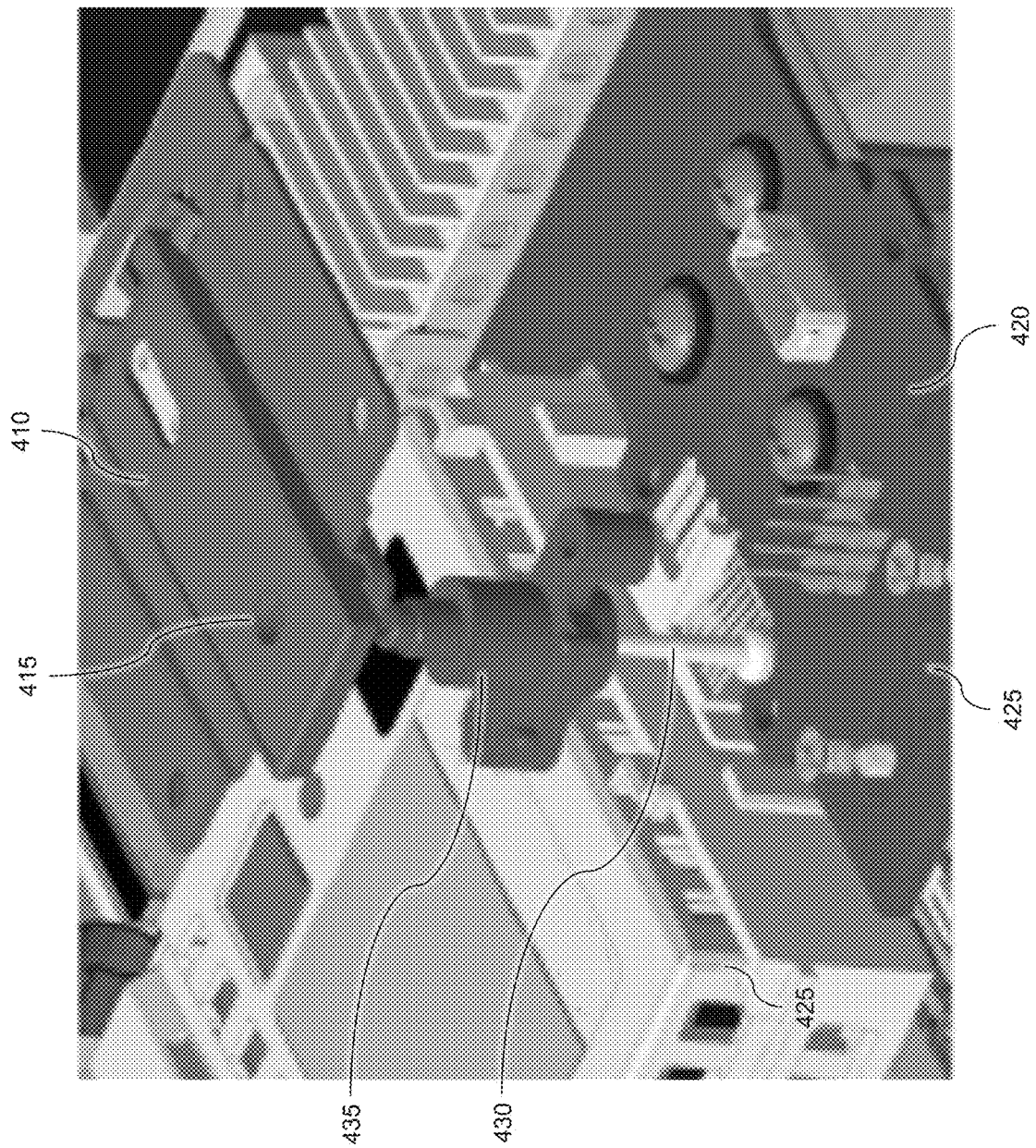

FIGS. 4A-4D show various views of an electronic equipment chassis 400 which, similar to the electronic equipment chassis 300, is in a rackmount server form factor. It should be appreciated, however, the electronic equipment chassis described herein need not necessarily be in a rackmount server form factor. FIG. 4A shows a top view of a portion of the electronic equipment chassis 400, including the lid or cover 405 and latch 410. FIG. 4B shows another top view of a portion of the electronic equipment chassis, but without the lid 405, showing how the latch 410 is placed over a BBU 420 of hardware IT assets housed within the electronic equipment chassis 400. FIG. 4C shows a perspective view of the latch 410, including a luminous hole 415 which aligns with a light pipe 430 coupled to the BBU 420 as shown in FIG. 4D. FIG. 4D shows an exploded view of the latch 410 and portions of the hardware IT assets housed within the electronic equipment chassis 400, including the BBU 420, an LED 425 thereof, the light pipe 430, and a light pipe holder 435. The luminous hole 415 of the latch 410 is illustratively aligned with the LED 425 via the light pipe 430 and light pipe holder 435, with the BBU 420 controlling the LED 425 in order to communicate status of one or more designated types of operations that are being performed on the hardware IT assets (e.g., a storage system) that is housed within the electronic equipment chassis 400).

Figure 5A:
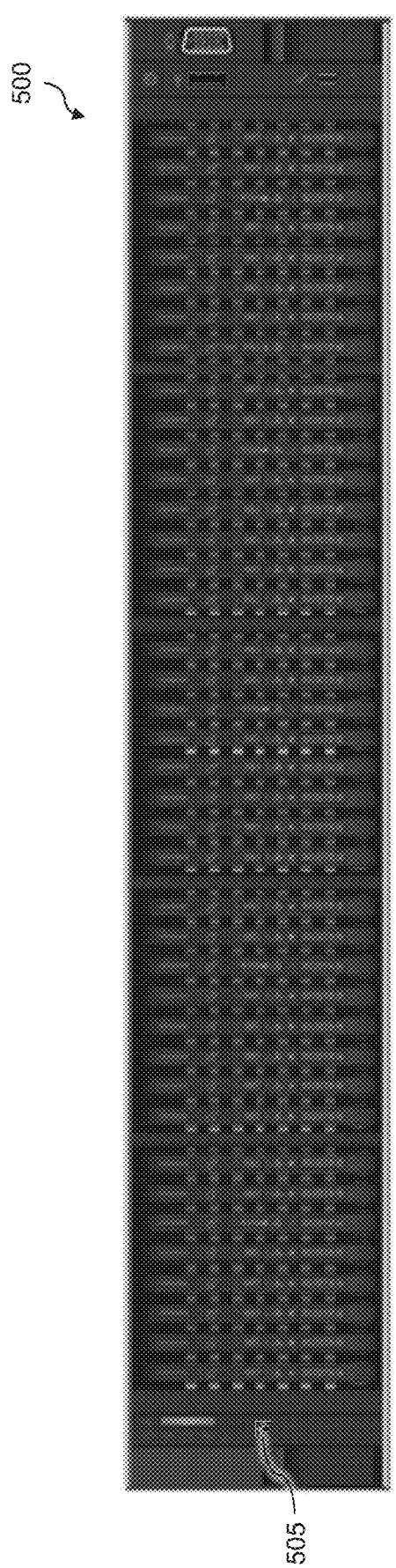
FIGS. 5A-5C show views of status indicators presented on a storage system housing latch, a storage system housing front panel, and a storage system controller graphical user interface in an illustrative embodiment.
Figure 5B:
Figure 5C:
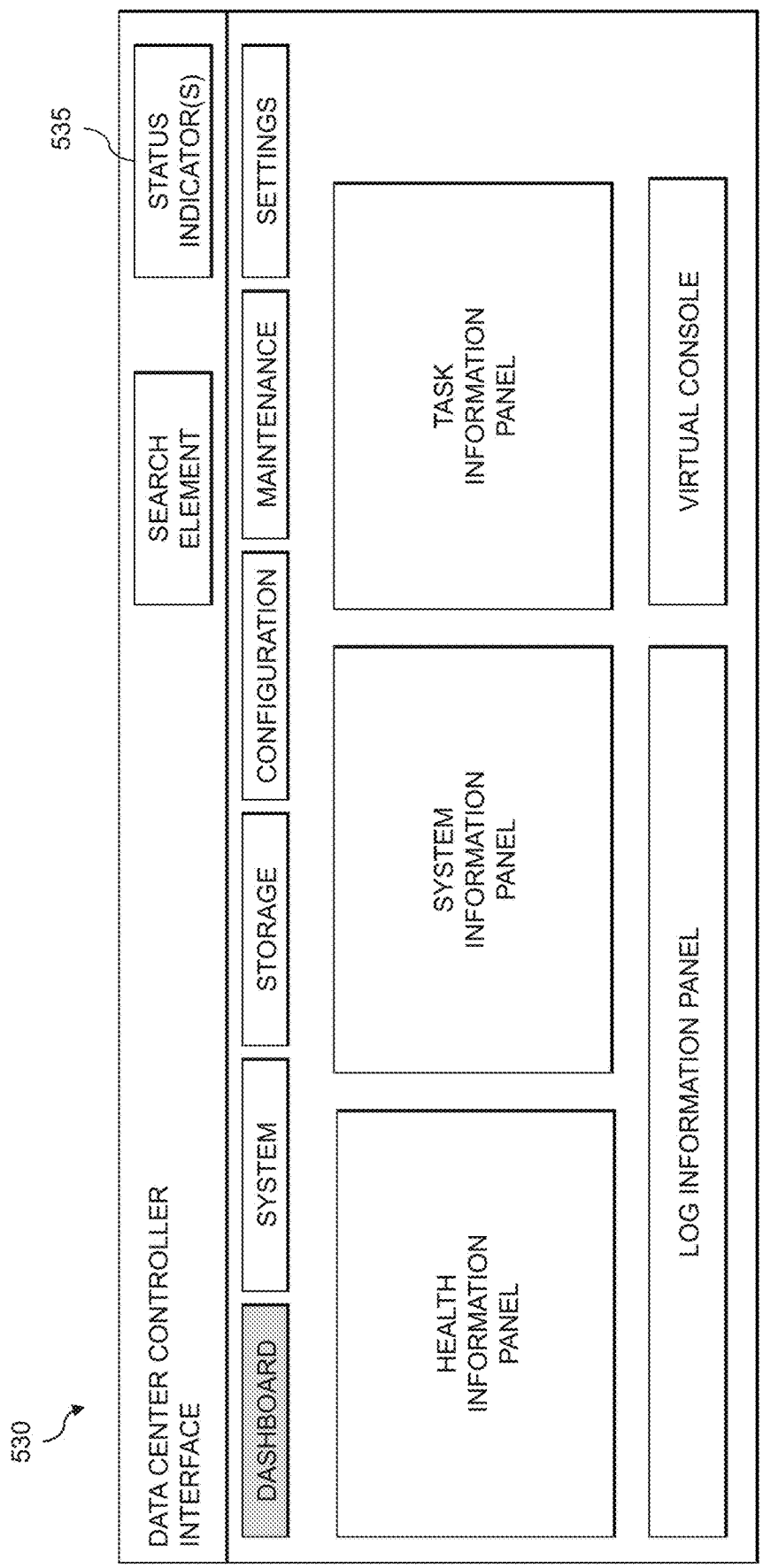

FIGS. 5A-5C illustrate different locations at which status indicators may be synchronized to provide an improved UX and to help mitigate potential negative impacts associated with opening or removing a lid or cover of an electronic equipment chassis 500 while certain designated types of operations are being performed on the hardware IT assets housed in the electronic equipment chassis 500. FIG. 5A shows a front view of the electronic equipment chassis 500, including a control panel (e.g., at a left section thereof) which includes various status indicators (e.g., in the form of lights such as LEDs), including a status indicator 505 that is configured to be controlled based on the status of designated types of operations being performed on the hardware IT assets housed in the electronic equipment chassis 500. FIG. 5B shows a view similar to that of FIG. 3B, highlighting a portion 510 of a top cover or lid of the electronic equipment chassis which includes a latch 515 having a status indicator 520 thereon, which is illustratively synchronized with the status indicator 505 and is also controlled based on the status of designated types of operations being performed on the hardware IT assets housed in the electronic equipment chassis 500. FIG. 5C shows an example of a GUI 530 provided by a controller (e.g., iDRAC) of the electronic equipment chassis 500, or of hardware IT assets housed therein. Here, the GUI 530 provides a data center controller interface, with various tabs or pages for a dashboard, system, storage, configuration, maintenance and settings, of which the dashboard tab or page is selected and shown including a health information panel, a system information panel, a task information panel, a log information panel, and a virtual console. The title bar of upper portion of the data center controller interface includes a search element, as well as one or more status indicators 535, which are illustratively synchronized with the status indicators 505 and 520 and are controlled based on the status of designated types of operations being performed on the hardware IT assets housed in the electronic equipment chassis 500. Advantageously, the status indicators 535 may be persisted in the data center controller interface (e.g., at the top right corner thereof) regardless of which tab or page (e.g., the dashboard, system, storage, configuration, maintenance and settings) is opened, such that an operator, customer or end-user would always be made aware of whether the designated types of operations are currently running (e.g., which would potentially lead to negative impacts, such as DL, if a lid or cover of the electronic equipment chassis 500 were opened while the designated types of operations are running).

In some embodiments, the status indicators 535 on the GUI 530 are made selectable, such that an operator, customer or other end-user may activate the status indicator 535 (which synchronizes with status indicators 505 and 520) in order for the operator, customer or other end-user to signal or communicate that it is currently unsafe to open or remove the lid of the electronic equipment chassis 500. This could be due to the operator, customer or other end-user's knowledge of current or upcoming scheduled operations which may result in negative impacts if the lid of the electronic equipment chassis 500 were opened at such times. It should be noted that, in embodiments where the status indicators 535 are selectable, the operator, customer or end-user may only be permitted to de-activate the status indicators 535 (and the status indicators 505 and 520 which are linked or synchronized therewith) if it is determined that there are no operations being currently performed which may result in negative impacts if the lid of the electronic equipment chassis 500 were opened while such operations are being performed. In other words, the operator, customer or end-user at the GUI 530 may be prevented from de-activating the status indicators 535 when the system otherwise detects that such status indicators 535 should be activated.

Figure 6A:
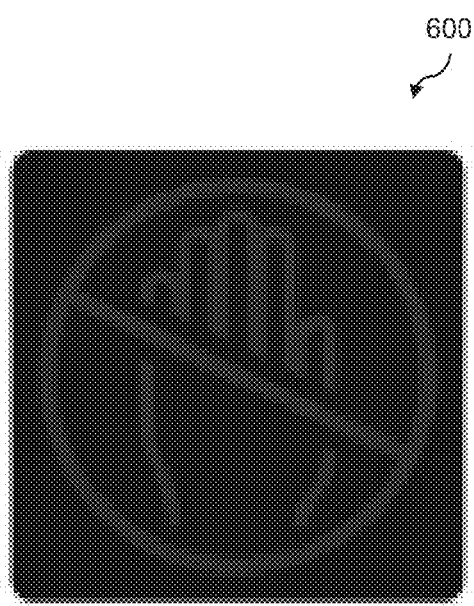
FIGS. 6A and 6B show views of a status indicator icon in an illustrative embodiment.
Figure 6B:
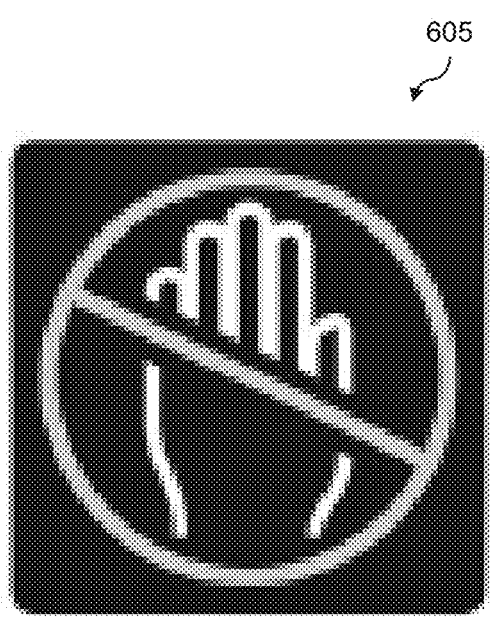

FIGS. 6A and 6B show examples of a status indicator icon which may be used in some embodiments. More particular, FIG. 6A shows the icon 600 while it is not illuminated and FIG. 6B shows the icon 605 illuminated. The illuminated icon 605 indicates an unsafe to remove status, while the blank or non-illuminated icon 600 indicates a safe to remove status. The icons 600, 605 are designed for user recognition, and compliance with International Organization for Standardization (ISO) 7000 and International Electrotechnical Commission (IEC) 60417 standards for graphical symbols on electronic equipment. The "off" icon 600 uses a dead font, while the "on" icon 605 has a circle and dash in a first color (e.g., yellow) with the hand in a second color (e.g., white). The icons 600, 605 may be a standard size, such as 10 millimeters (mm) height by 10 mm width.

The icons 600, 605 may be used for the various status indicators described herein, such as across the status indicators 505, 520, 535 shown and described with respect to FIGS. 5A-5C. It should be appreciated, however, that not all status indicators need use the icons 600, 605. For example, the status indicator 520 on the latch 515 (and similarly the status indicator 320 on latch 315) may be a circular light rather than the icons 600, 605.

Figure 7:
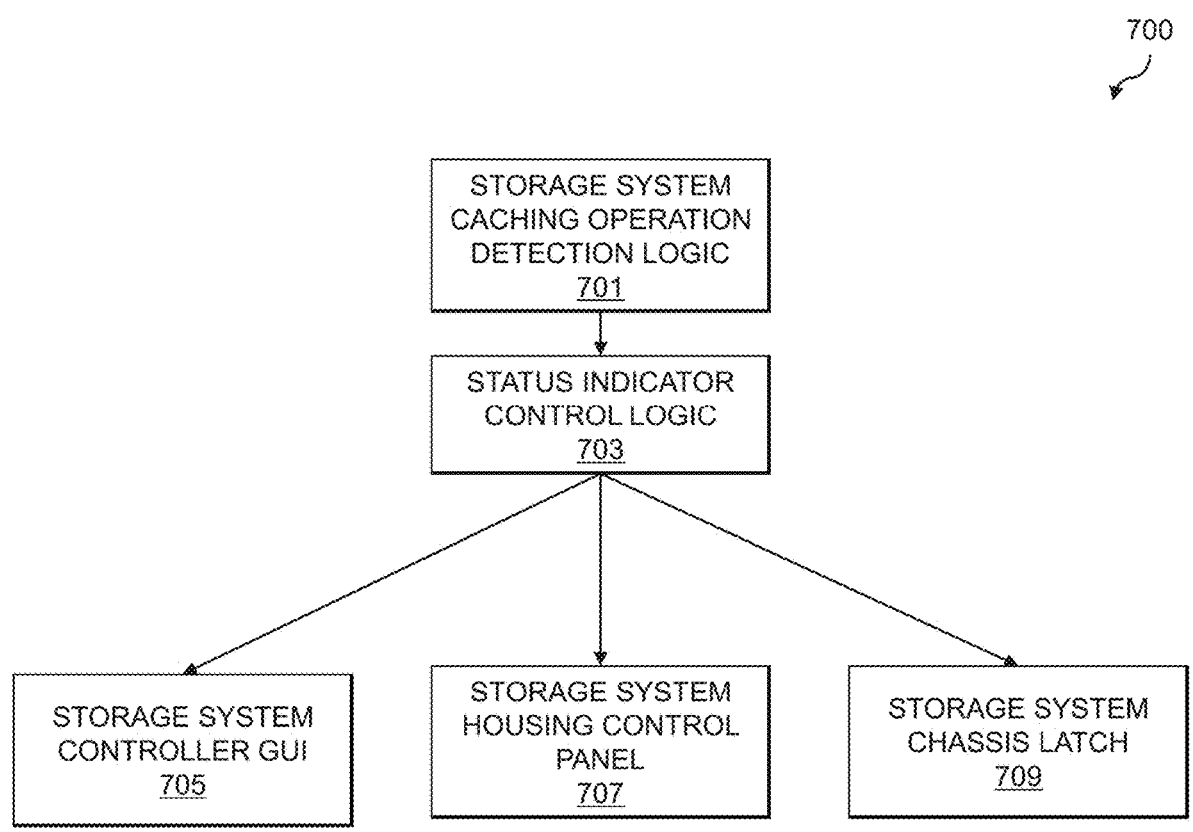
FIG. 7 shows a system configured for controlling status indicators on a storage system housing latch, a storage system housing front panel, and a storage system controller graphical user interface in an illustrative embodiment.

FIG. 7 shows a system 700 for synchronizing status indicators in the context of a storage system that is housed in an electronic equipment chassis. Here, the system 700 includes storage system caching operation detection logic 701 and status indicator control logic 703 (e.g., implemented by one or more storage controllers of the storage system). The storage system caching operation detection logic 701 is configured to detect when one or more designated types of operations (e.g., caching operations) are being performed on the storage system. The designated types of operations are those which would result in negative impacts such as DL in the storage system if a lid or cover of the electronic equipment chassis where the storage system is housed is opened or removed while such operations are ongoing. The status indicator control logic 703 is configured to control various status indicators in response to detection of such designated types of operations by the storage system caching operation detection logic 701. In this embodiment, the status indicator control logic 703 synchronizes status indicators located in a storage system controller GUI 705 (e.g., the status indicators 535 on the GUI 530 of FIG. 5C), on a storage system housing control panel 707 (e.g., the status indicator 505 on the front panel of electronic equipment chassis 500 of FIG. 5A), and on a storage system chassis latch 709 (e.g., the status indicator 520 on latch 515).

Figure 8:
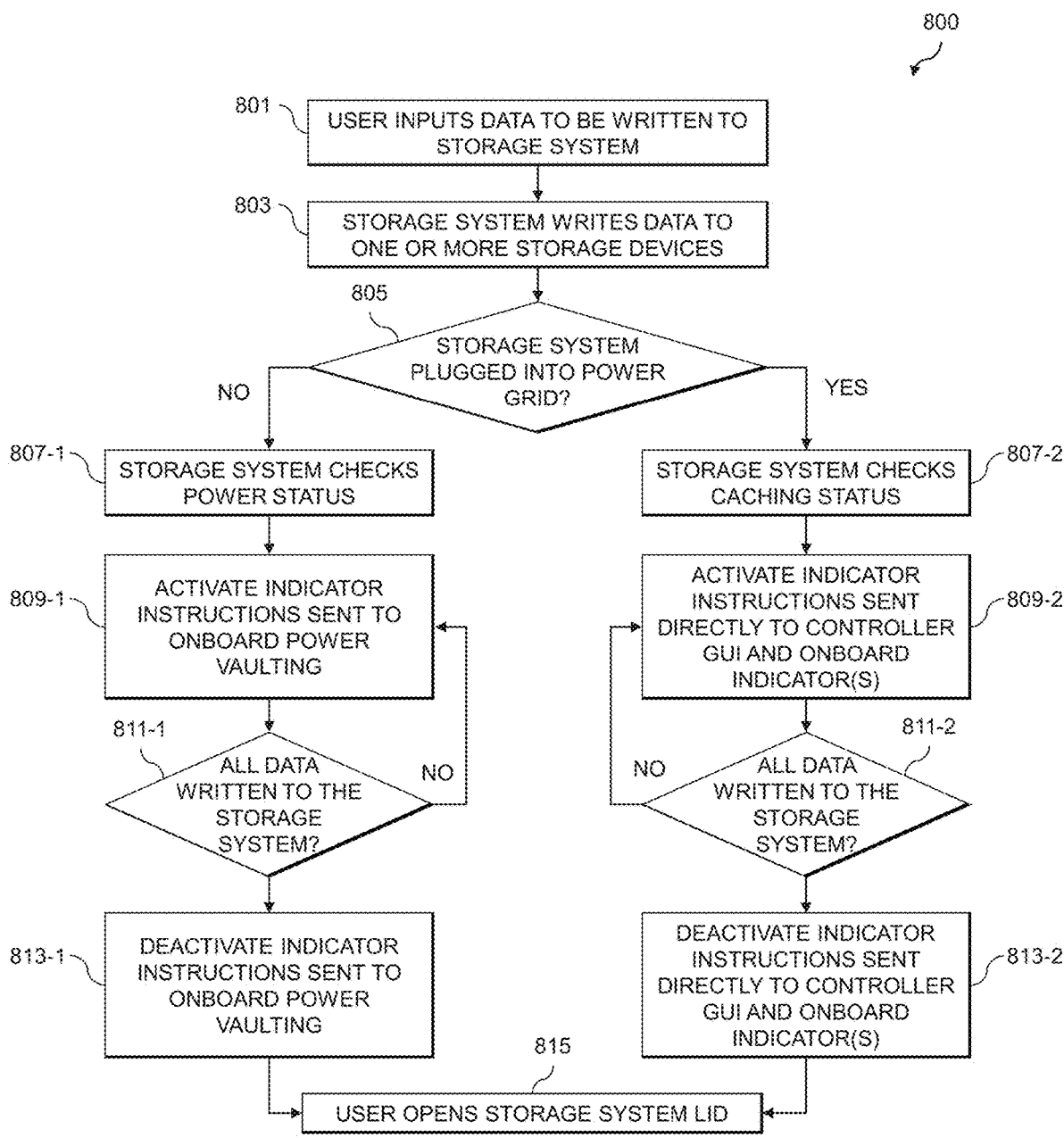
FIG. 8 shows a process flow for controlling status indicators of a storage system housing latch, a storage system housing front panel, and a storage system controller graphical user interface in an illustrative embodiment.

FIG. 8 shows a process flow 800 for controlling status indicators of a storage system, which may be implemented using the storage system caching operation detection logic 701 and the status indicator control logic 703 in the system 700 of FIG. 7. The process flow 800 starts with a user inputting data that is to be written to the storage system in step 801. In step 803, the storage system writes the data input in step 801 to one or more storage devices of the storage system. While step 803 is being performed, the data may be cached. While the data is cached, if a lid or cover of the electronic equipment chassis in which the storage system is being housed is opened or removed, then DL or other negative impacts may result. In step 805, a determination is made as to whether the storage system is plugged into a power grid (e.g., as opposed to a battery backup).

If the result of the step 805 determination is no, the process flow 800 proceeds to step 807-1 where the storage system checks the power status. Based on the power status, instructions to activate status indicators are sent to an onboard power vaulting component (e.g., a BBU) of the storage system in step 809-1. Such indicator activation instructions may include, for example, instructions to blink or flash the status indicators. In step 811-1, a determination is made as to whether all data (received in step 801) is successfully written to the storage system. If the result of the step 811-1 determination is no, the process flow 800 returns to step 809-1. If the result of the step 811-1 determination is yes, the process flow 800 proceeds to step 813-1 where instructions to deactivate the status indicators are sent to the onboard power vaulting component of the storage system. Following step 813-1, the user opens or removes the lid or cover of the storage system housing in step 815.

If the result of the step 805 determination is yes, the process flow 800 proceeds to step 807-2 where the storage system checks the caching status. Based on the caching status, instructions to activate status indicators are sent directly to a controller GUI and onboard status indicators (e.g., on a control panel of the storage system housing, on a latch of the lid or cover of the storage system housing) in step 809-2. Such indicator activation instructions may include, for example, instructions to blink or flash the status indicators. In step 811-2, a determination is made as to whether all data (received in step 801) is successfully written to the storage system. If the result of the step 811-2 determination is no, the process flow 800 returns to step 809-2. If the result of the step 811-2 determination is yes, the process flow 800 proceeds to step 813-2 where instructions to deactivate the status indicators are sent directly to the controller GUI and the onboard indicators of the storage system. Following step 813-2, the user opens or removes the lid or cover of the storage system housing in step 815.

When a storage system or other storage appliance is in a data caching mode (e.g., step 807-2 indicates that data caching operations are ongoing), or if there is a power outage (e.g., step 807-1 indicates a loss of power when the storage system is not plugged into the power grid and enters a power vaulting state), status indicator control circuitry (e.g., an integrated controller such as a suitably modified iDRAC controller) will read and update the system status and communicate such status to various status indicators (e.g., instructing a white LED on a chassis latch to blink or otherwise communicate an unsafe to remove status). The system status will also be communicated simultaneously (e.g., at or near the same time) to other status indicators (e.g., at a control panel of the housing such as a front-end of an electronic equipment chassis, at a GUI that monitors a data center including the storage system or other storage appliance, etc.). Once it is determined that power vaulting or data caching is complete (e.g., in step 811-1 or 811-2) such that data is safely migrated, then the status indicators may be deactivated or turned off (e.g., in step 813-1 or 813-2) and it is safe for the user to open or remove the lid of the chassis.

It is to be appreciated that the particular advantages described above and elsewhere herein are associated with particular illustrative embodiments and need not be present in other embodiments. Also, the particular types of information processing system features and functionality as illustrated in the drawings and described above are exemplary only, and numerous other arrangements may be used in other embodiments.

Illustrative embodiments of processing platforms utilized to implement functionality for controlling multiple status indicators for electronic equipment housed in an electronic equipment chassis will now be described in greater detail with reference to FIGS. 9 and 10. Although described in the context of system 100, these platforms may also be used to implement at least portions of other information processing systems in other embodiments.

Figure 9:
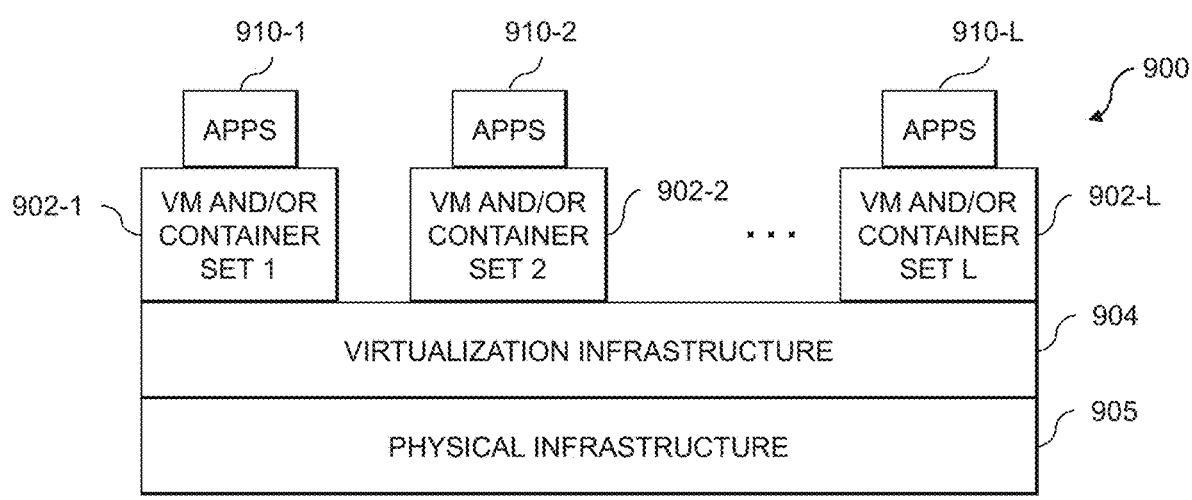
FIGS. 9 and 10 show examples of processing platforms that may be utilized to implement at least a portion of an information processing system in illustrative embodiments.
Figure 10:
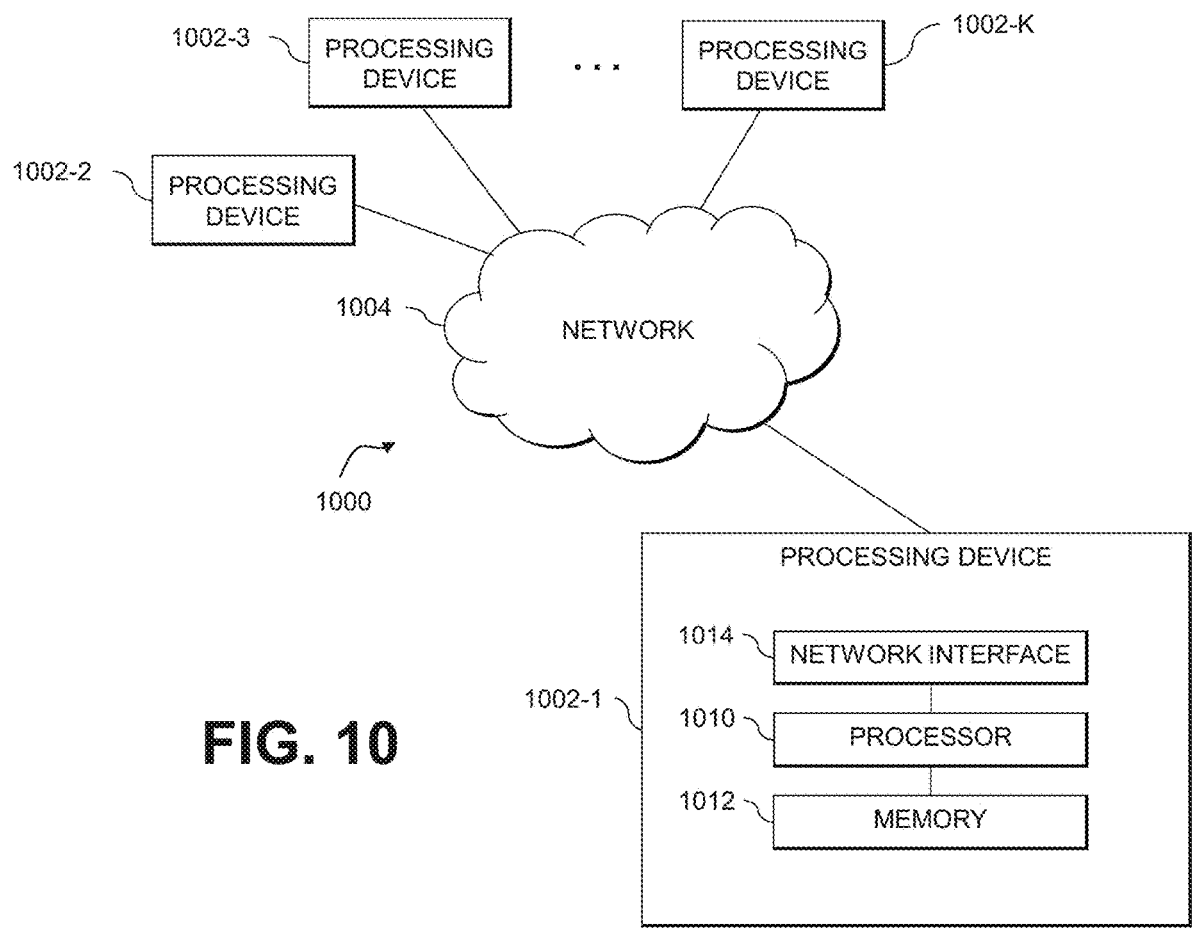

FIG. 9 shows an example processing platform comprising cloud infrastructure 900. The cloud infrastructure 900 comprises a combination of physical and virtual processing resources that may be utilized to implement at least a portion of the information processing system 100 in FIG. 1. The cloud infrastructure 900 comprises multiple virtual machines (VMs) and/or container sets 902-1, 902-2, . . . 902-L implemented using virtualization infrastructure 904. The virtualization infrastructure 904 runs on physical infrastructure 905, and illustratively comprises one or more hypervisors and/or operating system level virtualization infrastructure. The operating system level virtualization infrastructure illustratively comprises kernel control groups of a Linux operating system or other type of operating system.

The cloud infrastructure 900 further comprises sets of applications 910-1, 910-2, . . . 910-L running on respective ones of the VMs/container sets 902-1, 902-2, . . . 902-L under the control of the virtualization infrastructure 904. The VMs/container sets 902 may comprise respective VMs, respective sets of one or more containers, or respective sets of one or more containers running in VMs.

In some implementations of the FIG. 9 embodiment, the VMs/container sets 902 comprise respective VMs implemented using virtualization infrastructure 904 that comprises at least one hypervisor. A hypervisor platform may be used to implement a hypervisor within the virtualization infrastructure 904, where the hypervisor platform has an associated virtual infrastructure management system. The underlying physical machines may comprise one or more distributed processing platforms that include one or more storage systems.

In other implementations of the FIG. 9 embodiment, the VMs/container sets 902 comprise respective containers implemented using virtualization infrastructure 904 that provides operating system level virtualization functionality, such as support for Docker containers running on bare metal hosts, or Docker containers running on VMs. The containers are illustratively implemented using respective kernel control groups of the operating system.

As is apparent from the above, one or more of the processing modules or other components of system 100 may each run on a computer, server, storage device or other processing platform element. A given such element may be viewed as an example of what is more generally referred to herein as a "processing device." The cloud infrastructure 900 shown in FIG. 9 may represent at least a portion of one processing platform. Another example of such a processing platform is processing platform 1000 shown in FIG. 10.

The processing platform 1000 in this embodiment comprises a portion of system 100 and includes a plurality of processing devices, denoted 1002-1, 1002-2, 1002-3, . . . 1002-K, which communicate with one another over a network 1004.

The network 1004 may comprise any type of network, including by way of example a global computer network such as the Internet, a WAN, a LAN, a satellite network, a telephone or cable network, a cellular network, a wireless network such as a WiFi or WiMAX network, or various portions or combinations of these and other types of networks.

The processing device 1002-1 in the processing platform 1000 comprises a processor 1010 coupled to a memory 1012.

The processor 1010 may comprise a microprocessor, a microcontroller, an application-specific integrated circuit (ASIC), a field-programmable gate array (FPGA), a central processing unit (CPU), a graphical processing unit (GPU), a tensor processing unit (TPU), a video processing unit (VPU) or other type of processing circuitry, as well as portions or combinations of such circuitry elements.

The memory 1012 may comprise random access memory (RAM), read-only memory (ROM), flash memory or other types of memory, in any combination. The memory 1012 and other memories disclosed herein should be viewed as illustrative examples of what are more generally referred to as "processor-readable storage media" storing executable program code of one or more software programs.

Articles of manufacture comprising such processor-readable storage media are considered illustrative embodiments. A given such article of manufacture may comprise, for example, a storage array, a storage disk or an integrated circuit containing RAM, ROM, flash memory or other electronic memory, or any of a wide variety of other types of computer program products. The term "article of manufacture" as used herein should be understood to exclude transitory, propagating signals. Numerous other types of computer program products comprising processor-readable storage media can be used.

Also included in the processing device 1002-1 is network interface circuitry 1014, which is used to interface the processing device with the network 1004 and other system components, and may comprise conventional transceivers.

The other processing devices 1002 of the processing platform 1000 are assumed to be configured in a manner similar to that shown for processing device 1002-1 in the figure.

Again, the particular processing platform 1000 shown in the figure is presented by way of example only, and system 100 may include additional or alternative processing platforms, as well as numerous distinct processing platforms in any combination, with each such platform comprising one or more computers, servers, storage devices or other processing devices.

For example, other processing platforms used to implement illustrative embodiments can comprise converged infrastructure.

It should therefore be understood that in other embodiments different arrangements of additional or alternative elements may be used. At least a subset of these elements may be collectively implemented on a common processing platform, or each such element may be implemented on a separate processing platform.

As indicated previously, components of an information processing system as disclosed herein can be implemented at least in part in the form of one or more software programs stored in memory and executed by a processor of a processing device. For example, at least portions of the functionality for controlling multiple status indicators for electronic equipment housed in an electronic equipment chassis as disclosed herein are illustratively implemented in the form of software running on one or more processing devices.

It should again be emphasized that the above-described embodiments are presented for purposes of illustration only. Many variations and other alternative embodiments may be used. For example, the disclosed techniques are applicable to a wide variety of other types of information processing systems, storage systems, status indicators, etc. Also, the particular configurations of system and device elements and associated processing operations illustratively shown in the drawings can be varied in other embodiments. Moreover, the various assumptions made above in the course of describing the illustrative embodiments should also be viewed as exemplary rather than as requirements or limitations of the disclosure. Numerous other alternative embodiments within the scope of the appended claims will be readily apparent to those skilled in the art.

What is claimed is:

1. An apparatus comprising:
an electronic equipment chassis comprising a housing and at least one lid, the housing comprising a control panel with a first set of one or more status indicators;
at least one latch configured for securing the at least one lid to the housing, the at least one latch comprising a second set of one or more status indicators; and
at least one processing device comprising a processor coupled to a memory;
the at least one processing device being configured to perform steps of:
determining status information for electronic equipment housed in the electronic equipment chassis, the status information characterizing whether at least one of opening and removing the at least one lid is safe to perform at a given time; and
controlling, based at least in part on the determined status information, (i) at least one of the first set of one or more status indicators and (ii) at least one of the second set of one or more status indicators;
wherein controlling (i) the at least one of the first set of one or more status indicators and (ii) the at least one of the second set of one or more status indicators comprises activating one of a plurality of different status indicator patterns, the activated one of the plurality of different status indicator patterns being selected based at least in part on determining a relative risk associated with at least one of opening and removing the at least one lid at the given time.

2. The apparatus of claim 1 wherein determining the status information comprises determining whether one or more designated types of operations are at least one of currently being performed and scheduled to be performed within a designated period of time from a current time utilizing the electronic equipment housed in the electronic equipment chassis.

3. The apparatus of claim 2 wherein the electronic equipment housed in the electronic equipment chassis comprises at least one computing device, and wherein the one or more designated types of operations comprise one or more shutdown operations performed on the at least one computing device in response to disruption of power supplied to the at least one computing device.

4. The apparatus of claim 3 wherein the one or more shutdown operations performed on the at least one computing device in response to disruption of power supplied to the at least one computing device comprise persisting data stored in volatile memory of the at least one computing device to non-volatile memory.

5. The apparatus of claim 3 wherein the electronic equipment housed in the electronic equipment chassis comprises a storage system, and wherein the one or more designated types of operations comprise one or more data caching operations.

6. The apparatus of claim 5 wherein at least one of opening and removing the at least one lid while the one or more data caching operations are being performed results in potential data loss in the storage system.

7. The apparatus of claim 1 wherein the at least one of the first set of one or more status indicators and the at least one of the second set of one or more status indicators each comprise one or more indicator lights.

8. The apparatus of claim 7 wherein controlling (i) the at least one of the first set of one or more status indicators and (ii) the at least one of the second set of one or more status indicators based at least in part on the determined status information comprises:
activating a first designated light pattern utilizing the one or more indicator lights responsive to the determined status information characterizing that at least one of opening and removing the at least one lid is safe to perform at the given time; and
activating a second designated light pattern utilizing the one or more indicator lights responsive to the determined status information characterizing that at least one of opening and removing the at least one lid is not safe to perform at the given time.

9. The apparatus of claim 8 wherein the second designated light pattern is selected from among a set of possible light patterns based at least in part on the relative risk associated with at least one of opening and removing the at least one lid at the given time, the relative risk being based at least in part on one or more designated types of operations that are at least one of currently being performed and are scheduled to be performed within a designated period of time from a current time utilizing the electronic equipment housed in the electronic equipment chassis.

10. The apparatus of claim 1 wherein the at least one latch is located over at least a portion of a battery backup unit circuit board of the electronic equipment housed in the electronic equipment chassis.

11. The apparatus of claim 10 wherein the at least one latch comprises one or more luminous holes aligned with one or more light-emitting diodes of the battery backup unit circuit board, the one or more light-emitting diodes providing the second set of one or more status indicators.

12. The apparatus of claim 11 further comprising one or more light pipes and associated light pipe holders aligning the one or more luminous holes of the at least one latch with the one or more light-emitting diodes of the battery backup unit circuit board.

13. The apparatus of claim 1 wherein the control panel comprises a front of the housing of the electronic equipment chassis that is visible when the electronic equipment chassis in mounted in one or more equipment racks.

14. The apparatus of claim 1 wherein the at least one processing device is further configured to perform the step of controlling, based at least in part on the determined status information, at least one of a third set of one or more status indicators presented via a graphical user interface of a controller that monitors the electronic equipment housed in the electronic equipment chassis.

15. A computer program product comprising a non-transitory processor-readable storage medium having stored therein program code of one or more software programs, wherein the program code when executed by at least one processing device causes the at least one processing device to perform steps of:
   determining status information for electronic equipment housed in an electronic equipment chassis comprising a housing and at least one lid, the status information characterizing whether at least one of opening and removing the at least one lid is safe to perform at a given time; and
   controlling, based at least in part on the determined status information, (i) at least one of a first set of one or more status indicators of a control panel of the housing of the electronic equipment chassis and (ii) at least one of a second set of one or more status indicators proximate at least one latch configured for securing the at least one lid to the housing of the electronic equipment chassis;
   wherein controlling (i) the at least one of the first set of one or more status indicators and (ii) the at least one of the second set of one or more status indicators comprises activating one of a plurality of different status indicator patterns, the activated one of the plurality of different status indicator patterns being selected based at least in part on determining a relative risk associated with at least one of opening and removing the at least one lid at the given time.

16. The computer program product of claim 15 wherein determining the status information comprises determining whether one or more designated types of operations are at least one of currently being performed and scheduled to be performed within a designated period of time from a current time utilizing the electronic equipment housed in the electronic equipment chassis.

17. The computer program product of claim 15 wherein the program code when executed by the at least one processing device further causes the at least one processing device to perform the step of controlling, based at least in part on the determined status information, at least one of a third set of one or more status indicators presented via a graphical user interface of a controller that monitors the electronic equipment housed in the electronic equipment chassis.

18. A method comprising:
   determining status information for electronic equipment housed in an electronic equipment chassis comprising a housing and at least one lid, the status information characterizing whether at least one of opening and removing the at least one lid is safe to perform at a given time; and
   controlling, based at least in part on the determined status information, (i) at least one of a first set of one or more status indicators of a control panel of the housing of the electronic equipment chassis and (ii) at least one of a second set of one or more status indicators proximate at least one latch configured for securing the at least one lid to the housing of the electronic equipment chassis;
   wherein controlling (i) the at least one of the first set of one or more status indicators and (ii) the at least one of the second set of one or more status indicators comprises activating one of a plurality of different status indicator patterns, the activated one of the plurality of different status indicator patterns being selected based at least in part on determining a relative risk associated with at least one of opening and removing the at least one lid at the given time; and
   wherein the method is performed by at least one processing device comprising a processor coupled to a memory.

19. The method of claim 18 wherein determining the status information comprises determining whether one or more designated types of operations are at least one of currently being performed and scheduled to be performed within a designated period of time from a current time utilizing the electronic equipment housed in the electronic equipment chassis.

20. The method of claim 18 further comprising controlling, based at least in part on the determined status information, at least one of a third set of one or more status indicators presented via a graphical user interface of a controller that monitors the electronic equipment housed in the electronic equipment chassis.

* * * * *